United States Patent [19]
Van Amesfoort

[11] Patent Number: 5,712,596
[45] Date of Patent: Jan. 27, 1998

[54] TUNABLE CRYSTAL OSCILLATOR WITH HARMONIC OUTPUT

[75] Inventor: Alfonsus M. Van Amesfoort, Eindhoven, Netherlands

[73] Assignee: U.S. Philips Corporation, New York, N.Y.

[21] Appl. No.: 671,122

[22] Filed: Jun. 20, 1996

[30] Foreign Application Priority Data

Jun. 30, 1995 [EP] European Pat. Off. .............. 95201793

[51] Int. Cl.$^6$ .................. H03B 5/36; H03B 1/04
[52] U.S. Cl. .................. 331/76; 331/77; 331/116 R; 331/158; 331/177 V
[58] Field of Search .................. 331/76, 77, 166 R, 331/116 FE, 158, 177 V

[56] References Cited

U.S. PATENT DOCUMENTS

| | | | |
|---|---|---|---|
| 2,915,708 | 12/1959 | Mohler | 331/76 |
| 3,382,447 | 5/1968 | Racy | 331/77 |
| 3,528,032 | 9/1970 | Tahmisian, Jr. et al. | 331/76 |
| 5,309,116 | 5/1994 | Stone | 331/37 |

Primary Examiner—Siegfried H. Grimm

[57] ABSTRACT

In an oscillator arrangement (VCXO), an oscillation loop (OSL) oscillates at, approximately, the fundamental frequency of a crystal (XTL) included therein. The output signal (Sosc) of the oscillator arrangement (VCXO) is a harmonic extracted from the oscillation loop (OSL). To vary the frequency of the output signal (Sosc), a tuning circuit (VAR) is included in the oscillation loop (OSL). A stage (FIL) in the oscillator arrangement (VCXO) prevents harmonic feedback into the oscillation loop (OSL). Such an oscillator arrangement (VCXO) can be tuned over a relatively large frequency range and has a monotonous tuning characteristic.

9 Claims, 3 Drawing Sheets

TUNABLE CRYSTAL OSCILLATOR WITH HARMONIC OUTPUT

BACKGROUND OF THE INVENTION

1. Field of the Invention

The invention relates to an oscillator arrangement comprising a crystal which is part of an oscillation loop for an oscillation at, approximately, a fundamental frequency of said crystal, and a filter for passing a harmonic of said oscillation to an output.

The invention aim relates to a receiver for receiving a transmission signal including a reference frequency signal.

2. Description of the Related Art

The Radio Amateur's Handbook, 57th edition, 1980, published by the American Radio Relay League, describes various crystal oscillators. FIG. 5c on page 6-3 of the cited Handbook shows a Colpitts type of crystal oscillator. This oscillator, like any oscillator, comprises an oscillation loop to initiate and maintain an oscillation at a specific frequency. In FIG. 5, the oscillation loop includes a transistor of the type "2N2222" as an amplifying element. It also includes a capacitor between the base and the emitter of this transistor, a capacitor between the emitter and signal ground, and a crystal between the base and signal ground. The crystal, which has a resonance frequency f, is the frequency-determining element in the oscillation loop.

A tuned circuit is coupled between the collector of the transistor and the output of the oscillator concerned. The collector may be regarded as a tapping point of the oscillation loop. The tuned circuit extracts the desired harmonic of the resonance frequency f from the oscillation loop. For example, the resonance frequency of the tuned circuit is three times the crystal frequency f. In that case, the oscillator output signal substantially comprises the third harmonic of the crystal frequency f. To improve spectral purity of the output signal, a double-tuned circuit or a harmonic filter following the tuned circuit may be employed. Thus, harmonics other than the third harmonic which are also present in the oscillation loop are suppressed.

SUMMARY OF THE INVENTION

It is an object of the invention to provide an oscillator arrangement of the type identified in the opening paragraph, the frequency of which is control/able and the frequency control characteristic is monotonous.

In accordance with a first aspect of the invention, the oscillation loop of such an oscillator arrangement includes tuning means for varying the frequency of the oscillation therein, and the oscillator arrangement includes a stage for preventing feedback of the harmonic extracted by the filter into the oscillation loop.

The invention is based on the recognition that feedback of the extracted harmonic into the oscillation loop influences the frequency control characteristic. By preventing such feedback, a monotonous frequency control characteristic can be obtained over a relatively wide tuning range.

Thus, in an oscillator arrangement according to the invention, the tunable oscillation loop oscillates at, approximately, the fundamental frequency of the crystal. The signal in the oscillation loop is distorted and, consequently, comprises harmonics of the fundamental frequency. A relatively high frequency output signal is obtained by extracting the desired harmonic from the oscillation loop by means of the filter.

An oscillator arrangement according to the invention has several advantages as compared with tunable overtone crystal oscillators. Tunable overtone crystal oscillators oscillate at an overtone frequency of the crystal which is, approximately, a harmonic of the fundamental frequency. One advantage of the present invention is a larger tuning range. Given the tuning means, for example, a varactor of a particular type, a fundamental frequency oscillation can be varied over a larger frequency range than an overtone frequency oscillation. Another advantage is that crystals designed for fundamental frequency oscillation are generally cheaper than crystals designed for overtone frequency oscillation.

In accordance with a second aspect of the invention, a receiver for receiving a transmission signal including a reference frequency signal comprises an oscillator arrangement, as defined above, for reproducing the reference frequency signal by means of a synchronization loop.

The monotonous frequency characteristic of the oscillator arrangement prevents malfunctioning of the synchronization loop, which would jeopardize reception. If, in contrast, the frequency control characteristic of the oscillator arrangement were non-monotonous, the sign of the loop transfer would change at some operating point. This could lead to a loss of synchronisation and, consequently, a loss of reception.

An advantage of the invention is the relatively simple structure of an oscillator arrangement according to the invention. In accordance with these aspects, the filter for extracting the desired harmonic also prevents feedback of this harmonic into the oscillation loop. Moreover, the filter comprises only few elements.

An advantage of the invention is that the oscillation loop is relatively insensitive to the load impedance at the output of the oscillator arrangement.

Another advantage of the invention is that the output signal of the oscillator arrangement has a good spectral purity.

These and other aspects and advantages of the invention will be apparent from and elucidated with reference to the embodiments described hereinafter.

BRIEF DESCRIPTION OF THE DRAWINGS

In the drawings.

Throughout the drawings, like reference signs denote like elements and parts.

DESCRIPTION OF THE PREFERRED EMBODIMENTS

First, the effects of harmonic feedback into an oscillation loop OSL are discussed in greater detail. Subsequently, embodiments of the invention, in which such feedback is prevented, are presented by way of example. Next, some aspects and advantages of the invention are highlighted with reference to the embodiments presented. Finally, some other possible embodiments are touched upon, to illustrate the scope of the invention.

Figure 1A:
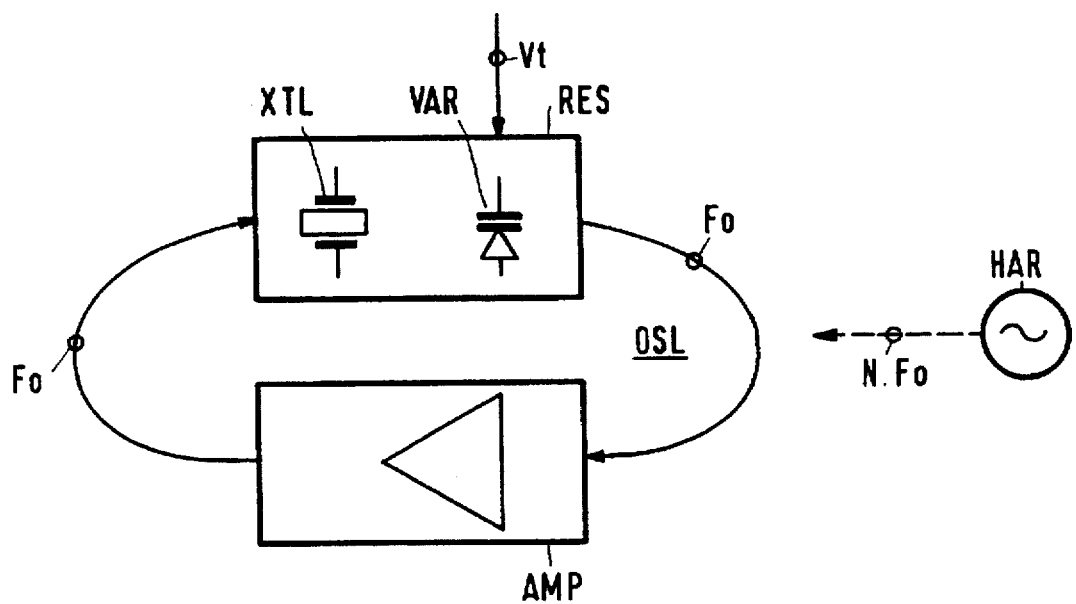
FIG. 1a is an abstract representation of harmonic feedback into an oscillation loop.

FIG. 1a shows an oscillation loop OSL formed by an amplifier AMP and a resonator RES which includes a crystal XTL. The oscillation loop oscillates at a frequency Fo which is, approximately, the fundamental frequency of the crystal XTL. The resonator RES further includes tuning means VAR for varying the oscillation frequency Fo, for example, in response to a tuning voltage Vt applied thereto.

In FIG. 1a, the feedback of the N-th harmonic of the oscillation frequency Fo is reflected by a signal source HAR which provides a signal at frequency N.Fo and by a dotted arrow directed to the oscillation loop OSL. The N-th harmonic is injected into the oscillation loop OSL and is therefore present in this loop, together with the oscillation at frequency Fo.

The amplitude of the N-th harmonic fed back in the oscillation loop OSL is influenced by the loop gain at frequency N.Fo. The oscillation loop gain peaks at a frequency which slightly differs from frequency N.Fo. This is due to resonances of the crystal XTL at overtone frequencies. Overtone frequencies are very nearly, but not exactly, harmonics of the crystal fundamental frequency. For example, if the fundamental frequency of crystal XTL is 10.000 MHz, the third overtone frequency may be 28.984 MHz. Thus, the third overtone frequency is offset 16 kHz with respect to the third harmonic of the fundamental frequency, which is 30 MHz.

Figure 1B:
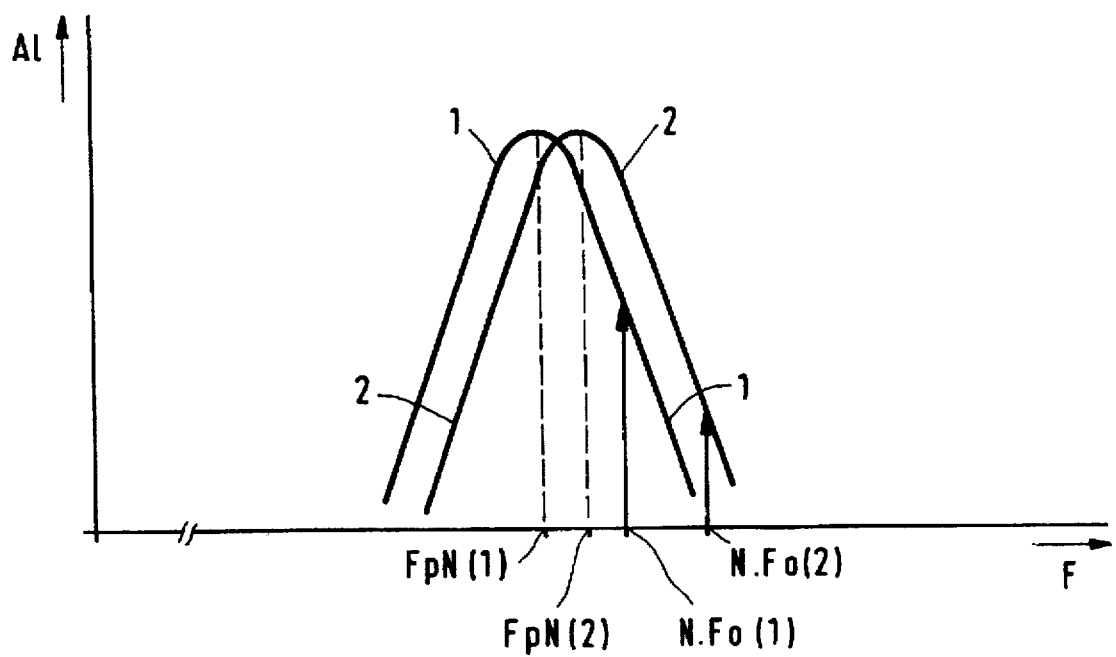
FIG. 1b is a graph showing the oscillation loop gain versus frequency near an overtone of a crystal to explain the effect of harmonic feedback.

FIG. 1b shows two plots, denoted 1 and 2, of the oscillation loop gain (Al) versus frequency (F) near the N-th overtone of crystal XTL. The two plots 1 and 2 relate to different tuning voltages Vt(1) and Vt(2), respectively, applied to the tuning means VAR shown in FIG. 1a. At tuning voltage Vt(1), the oscillation loop gain peaks at frequency FpN(1), and at tuning voltage Vt(2), it peaks at frequency FpN(2). Furthermore, at tuning voltage Vt(1), the oscillation frequency is Fo(1) and at tuning voltage Vt(2), the oscillation frequency is Fo(2). The N-th harmonics of these oscillation frequencies, N.Fo(1) and N.Fo(2), respectively, are indicated in FIG. 1b.

It can be understood from FIG. 1b that, in the oscillation loop OSL, the amplitude of the N-th harmonic having frequency N.Fo(1) is larger than the amplitude of the N-th harmonic having frequency N19 Fo(2). In other words, in the case of tuning voltage Vt(1), the oscillation loop OSL is more sensitive to harmonic feedback than at the tuning voltage Vt(2). This is because, the peak in the oscillation loop gain is closer to the N-th harmonic of the oscillation frequency at tuning voltage Vt(1) than at tuning voltage Vt(2).

Thus, the amplitude of the N-th harmonic of the oscillation frequency, which is fed back into the oscillation loop, varies with the tuning voltage. The underlying cause of this effect is that a peak in the oscillation loop gain is not tuned to the same extent as the nearest harmonic of the oscillation frequency.

The amplitude of the N-th harmonic which has been fed back into the oscillation loop OSL, as reflected in FIG. 1a, influences the oscillation frequency Fo. Any variation in the amplitude, as illustrated in FIG. 1b, produces a kind of parasitic frequency adjustment. This parasitic frequency adjustment may be of opposite sign with respect to the frequency control, in the absence of any harmonic feedback, effectuated through the tuning means VAR shown in FIG. 1a. Furthermore, the parasitic frequency adjustment may even prevail at some points and may consequently, cause the sign of a frequency variation to change. If this is the case, then the tuning voltage to frequency characteristic is non-monotonous.

Figure 2:
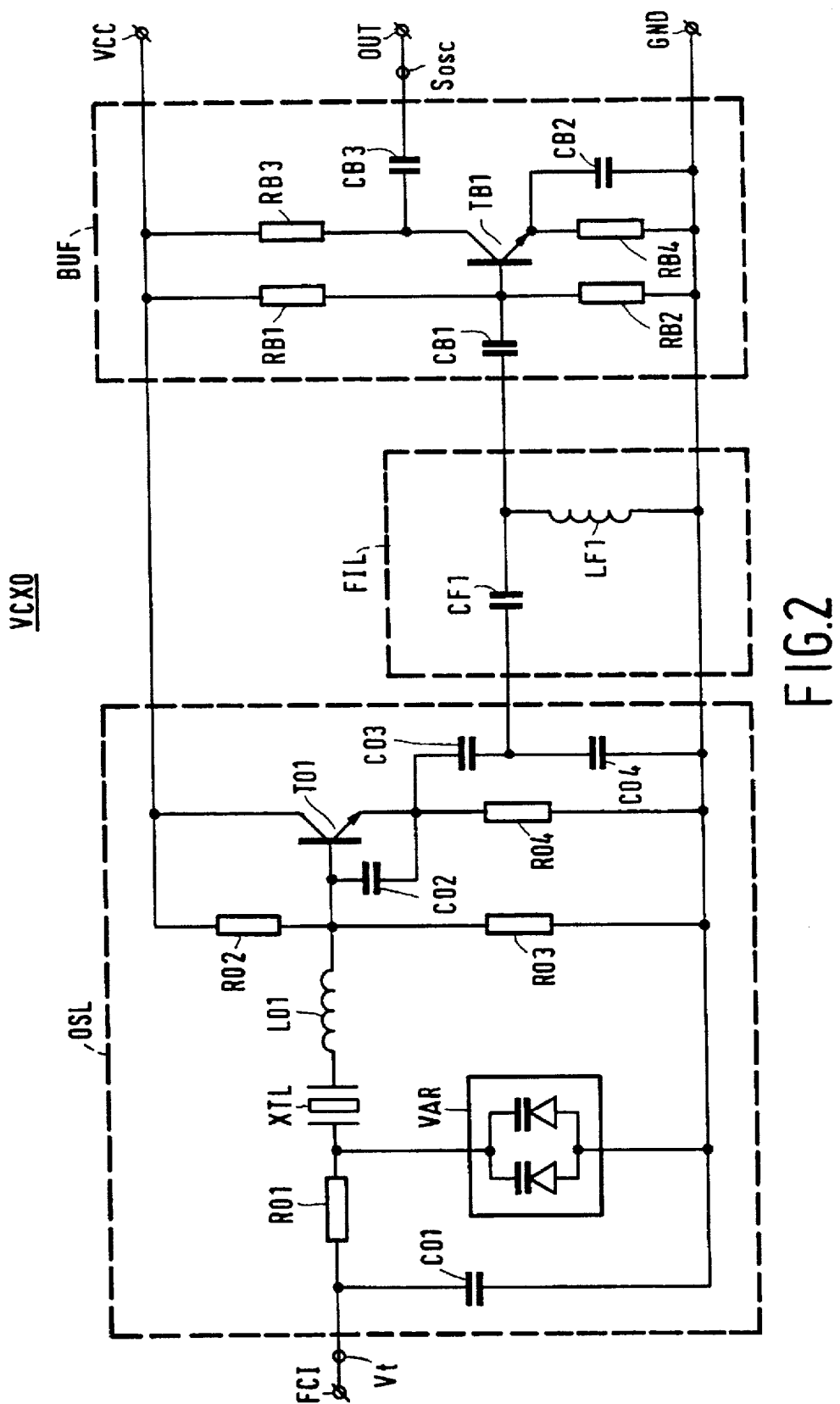
FIG. 2 is a circuit diagram of an oscillator arrangement which is an embodiment of invention.

FIG. 2 shows an oscillator arrangement, which is an embodiment of the invention, wherein harmonic feedback is prevented. The oscillator arrangement has four terminals: a signal ground terminal GND, a supply voltage terminal VCC, an output terminal OUT and a frequency control input FCI. If a suitable supply voltage is applied between the terminals GND and VCC, an oscillation output signal Sosc is provided at the terminal OUT. The frequency of this oscillation output signal can be varied by means of a tuning voltage Vt applied at the terminal FCI.

The oscillator arrangement of FIG. 2 can be divided into three sections: an oscillation loop OSL, a filter FIL and an output buffer BUF. The oscillation loop OSL oscillates approximately at the fundamental frequency of a crystal XTL in the loop. The filter FIL extracts a harmonic from the oscillation loop OSL, for example, the third harmonic of the oscillation signal in the loop. The output buffer transfers the extracted harmonic to the output terminal OUT of the oscillator arrangement shown in FIG. 2.

More specifically, the oscillation loop OSL in FIG. 2 is of the Colpitts type. Apart from the crystal XTL, it further comprises an electronically controllable reactance VAR, formed by two varactors in parallel, an inductance LO1 and capacitors CO2, CO3 and CO4. All these elements may be considered as parts of resonator RES as shown in FIG. 1a. Amplification in the oscillation loop is provided by transistor T01 which, together with bias resistors RO2, RO3 and RO4, may be considered as amplifier AMP shown in FIG. 1a.

The tuning voltage Vt is supplied to the electronically controllable reactance VAR via resistor RO1. The resistor RO1, in combination with a capacitor C01, prevents the occurrence of high frequency signals at the frequency control input FCI.

The filter FIL shown in FIG. 2 is a relatively simple asymmetrical bandpass filter formed by an inductor LF1 and a capacitor CF1. The passband is, of course, tuned to the desired harmonic of the fundamental frequency of the crystal XTL. The filter FIL is coupled to oscillation loop OSL by means of a capacitive voltage divider formed by capacitor CO3 and CO4. Viewed from this voltage divider, the filter FIL is terminated by the input impedance of the output buffer BUF.

Preferably, capacitors CO3 and CO4 have relatively large values, and the output buffer BUF has a relatively large input impedance. In that case, inductor LF1 and capacitor CF1 preferably have such values that the resonance frequency of these elements combined corresponds to the desired harmonic. The filter FIL shown in FIG. 2 then scales the voltage of the desired harmonic at the common node of the capacitors CO3 and CO4 to a higher value at the input of the output buffer BUF.

The output buffer BUF shown in FIG. 2 is a voltage amplifier with one transistor TB1 in a common emitter configuration. At relativity low frequencies, the voltage gain is the ratio of the value of resistor RB3, coupled to the collector of transistor TB1, and the value of the resistor RB4, coupled to the emitter. At relatively high frequencies, the gain is higher, namely, the ratio of value of resistor RB3 and the differential emitter resistance of the transistor TB1. Thus, the transfer characteristic of the output buffer BUF exhibits a high-pass slope.

The high-pass slope of output buffer BUF is preferably located between the fundamental frequency of crystal XTL and the desired harmonic to which the filter FIL is tuned. This can be achieved by appropriately choosing the values of the resistor RB4, the capacitor CB2 and resistors RB1 and RB2 coupled to the base of transistor TB1 for biasing. The low-frequency cut-off of the high-pass slope is mainly determined by the resistor RB4 and the capacitor CB2. The high-frequency cut-off is mainly determined by the resistors RB1, RB2 and RB4, which fix the differential emitter resistance of transistor TB1, and the capacitor CB2.

The output buffer further comprises capacitors CB1 and CB3 for DC-decoupling.

A practical implementation of the oscillator arrangement shown in FIG. 2 provides, for example, a frequency-stable and accurate, yet tunable, oscillation output signal Sosc of about 49.2 MHz. In the practical implementation, the crystal XTL has a fundamental resonance frequency of 16.4 MHz and the filter FIL extracts the third harmonic from the oscillation loop. Varactors of the type "BB126" are used for the controllable reactance VAR. The transistors TO1 and TB1 are of the type "BFS17".

Furthermore, in the practical embodiment, the following component values are used. For components in the oscillation loop OSL, which may be considered as parts of a resonator therein, the values are: LO1-1/µH; CO2-180pF; CO3-330pF; CO4-330pF. In the filter FIL, the values are: CF1-33pF; LF1-330nH. In the output buffer BUF, the values are: CB1-47pF; CB2-33pF; RB1-22kΩ; RB2-10kΩ, RB3-220Ω; RB4-220Ω. The practical embodiment works satisfactorily with a supply voltage of 5 Volts applied between the terminals GND and VCC. When the tuning voltage Vt is varied between 0 Volt and 5 Volts, the frequency of the oscillation output signal Sosc is varied over a range of 12 kHz.

Figure 3:
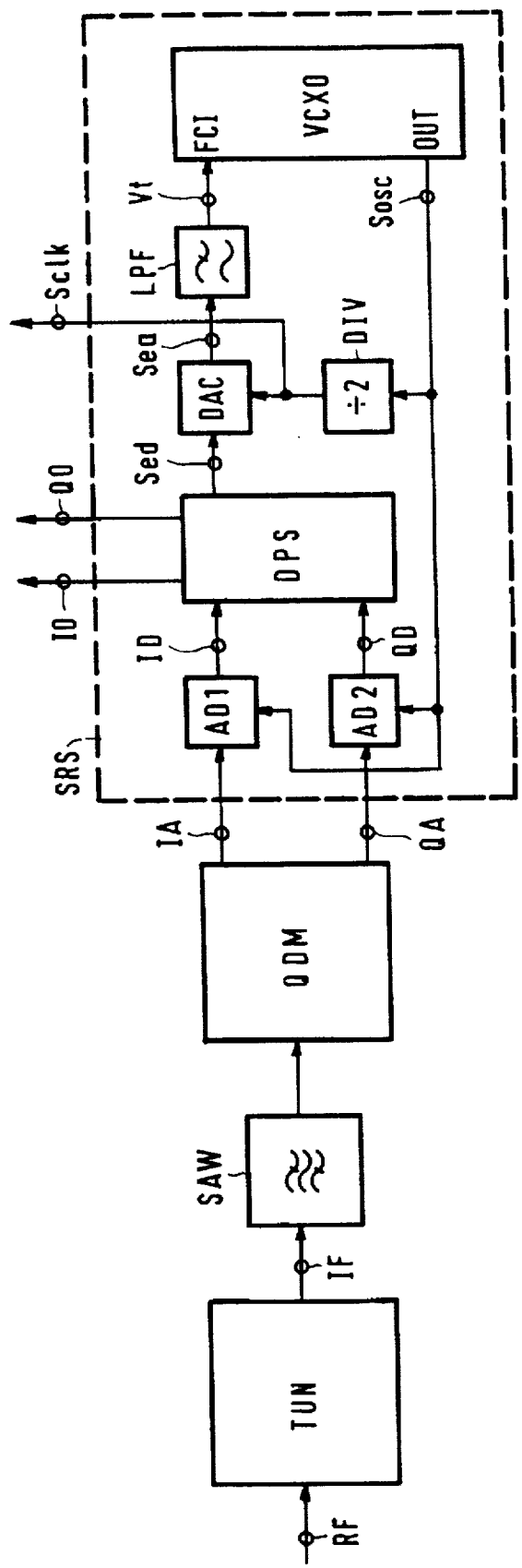
FIG. 3 is a block-schematic diagram of a receiver which is an embodiment of the invention and comprises the oscillator arrangement of FIG. 2.

FIG. 3 shows a receiver, which is an embodiment of the invention, incorporating the oscillator arrangement VCXO of FIG. 2. The receiver is, for example, an indoor unit for digital satellite TV reception. An outdoor unit (not shown) near the satellite dish supplies a signal RF to the receiver. The signal RF comprises carriers which are QPSK (=quadrature phase shift keying) or BPSK (=binary phase shift keying)-modulated with digital video signals. The signal RF results from a block conversion of the relevant satellite TV band in the outdoor unit and is located, for example, in a frequency band from 950 to 2050 MHz.

The receiver shown in FIG. 3 comprises three main functional parts: a tuner TUN, a quadrature alemodulator QDM and a symbol recovery section SRS. The tuner TUN is a standard indoor unit tuner. For example, it frequency-converts a desired satellite TV signal to an intermediate frequency signal IF of 70 MHz. The intermediate frequency signal IF is supplied to the quadrature demodulator QDM via a filter SAW of the surface-acoustic wave type. The filter SAW not only suppresses unwanted signals, but also provides a half Nyquist shaping—square-root raised cosine—of the QPSK signal.

In the quadrature demodulator QDM, the filtered intermediate frequency signal is multiplied by synchronous in-phase and quadrature carriers, resulting in in-phase and quadrature modulation signals IA and QA, respectively. These modulation signals are reconfigured in the symbol recovery section SRS into 3-bit quantized in-phase and quadrature signals IO and QO, which are supplied to a soft-decision Viterbi decoder (not shown). Furthermore, the symbol recovery section SRS derives a symbol clock signal Sclk from the in-phase and quadrature modulation signals IA and QA. The quadrature demodulator QDM and symbol recovery section SRS can be suitably realized, by applying integrated circuits of the types TDA 8040 and TDA 8041, respectively.

More specifically, in the symbol recovery section SRS, the oscillator arrangement VCXO is synchronised with the symbol clock frequency of the digital satellite TV signal, which is approximately 24.6 MHz. The synchronization is effectuated by means of a loop which comprises the following parts: A/D converters AD1 and AD2, a digital processing section DPS, a D/A-converter DAC, and a loop filter LPF.

The synchronization loop operates as follows. The oscillator arrangement VCXO determines the rate of the A/D converters AD1 and AD2 which digitize the analog in-phase and quadrature modulation signals IA and QA, respectively. As a result, the digitized in-phase and quadrature modulation signals ID and QD, provided by the A/D-converters AD1 and AD2, respectively, depend on the oscillation output signal Sosc and the analog modulation signals IA and IQ, respectively. The digital processing section DPS derives a digital error signal Sed from these digitized signals ID and QD.

The error signal Sed is representative of the (de-) synchronization of the oscillator arrangement VCXO with the symbol clock frequency of the digital satellite TV signal received. The D/A-converter DAC converts the digital synchronization error signal Sed into an analog error signal Sea which is supplied to the loop filter LPF. In response, the loop filter LPF supplies a tuning voltage Vt to the frequency control input terminal FCI of the oscillator arrangement VCXO. Preferably, the analog error signal Sea is a current and the loop filter LPF is an active filter, which integrates this current into the tuning voltage Vt. In such a way, the synchronization can be very accurate.

In the synchronized state, the frequency of the oscillation signal Sosc is twice the symbol clock frequency of the digital satellite TV signal received. That is, in the synchronized state, the frequency is approximately 49.2 MHz. The oscillation output signal Sosc is supplied to a divider DIV. The divider DIV, which has a division factor of 2, provides the symbol clock frequency signal Sclk which determines the rate of D/A converter DAC. The symbol clock frequency signal Sclk is used to further process (not shown) the 3-bit quantized in-phase and quadrature signals IO and QO. The digital processing section DPS derives these 3-bit quantized signals from the digitized in-phase and quadrature modulation signals ID and QD, respectively.

Some notable aspects and advantages of the invention are highlighted hereinafter with reference to the embodiments presented by way of example.

In the oscillator arrangement VCXO, shown in detail in FIG. 2, the filter FIL prevents harmonic feedback into the oscillation loop OSL. As a result, the frequency of the oscillation output signal Sosc varies monotonously with the tuning voltage Vt. The frequency can be tuned over a relatively large range within a given span of tuning voltage Vt. Nevertheless, due to the accuracy of the crystal XTL the free-running frequency of the oscillator arrangement VCXO is well-defined.

In the receiver shown in FIG. 3, the oscillator arrangement VCXO reliably synchronises with the symbol clock frequency in the received digital satellite TV signal. This is caused by the following factors. The initial synchronization error, between the symbol clock frequency and the free-running frequency of the oscillator arrangement, is relatively small. The relatively large tuning range of the oscillator arrangement VCXO permits this error to be corrected, so that synchronization is achieved. The monotonous frequency control characteristic of the oscillator arrangement VCXO, causes the sign of the synchronization loop transfer to be well-defined.

In the oscillator arrangement VCXO, shown in detail in FIG. 2, the transfer via the filter FIL from the oscillation loop OSL to the output buffer BUF differs from the transfer in the opposite direction. In the first-mentioned transfer, a signal voltage at the desired harmonic of the crystal XTL is amplified. In the oppositely directed transfer, harmonics are attenuated sufficiently to prevent adverse effects on the frequency control characteristic. Thus, the filter FIL combines two functions: on the one hand, it extracts the desired harmonic of the crystal XTL from the oscillation loop OSL and, on the other hand, it prevents harmonic feedback. This feature contributes to the relatively simple structure of the oscillator arrangement VCXO shown in FIG. 2.

The filter FIL, shown in FIG. 2, is a single-tuned remnant circuit formed by a single capacitor CF1 and a single inductor LF1. This filter FIL, which is tuned to the desired harmonic, not only combines the two above-mentioned functions but is, itself, a relatively simple and low-cost element.

In the oscillator arrangement VCXO, shown in detail in FIG. 2, the signal in the oscillation loop OSL is tapped by means of the voltage divider formed by capacitors CO3 and CO4. The oscillation loop OSL is therefore relatively insensitive to a load impedance which is coupled to the output terminal OUT.

In the previously mentioned practical implementation of the oscillator arrangement VCXO, the output buffer BUF has a relatively high input impedance. This is partly due to the relatively low value (47 pF) of the capacitance CB1. The input impedance of the output buffer BUF is effectively in parallel with the inductor LF1 and, consequently, affects the quality factor Q of the filter FIL. The higher the quality factor Q, the narrower the passband of the filter FIL, which is tuned to the desired harmonic of the crystal XTL, and the higher the voltage gain for this desired harmonic. Consequently, the relatively high input impedance of the output buffer BUF contributes to the spectral purity of the oscillation output signal Sosc. Furthermore, with only a relatively little gain provided by output buffer BUF, it causes this signal to have a sufficient amplitude.

In the practical implementation, the high-pass slope in the transfer characteristic of the output buffer BUF started at 22 MHz. Consequently, the output buffer BUF further suppresses the fundamental frequency of the crystal XTL, at 16.4 MHz, with respect to the desired third harmonic, at 49.2 MHz. This feature contributes to the relatively good spectral purity of the oscillation output signal Sosc, since the fundamental frequency is predominant in the oscillation loop OSL and, consequently, needs to be sufficiently suppressed.

It goes without saying that many implementations differing from the embodiments which have been presented by way of example, are possible without passing beyong the scope of the invention as claimed.

Instead of using the filter FIL as a stage preventing harmonic feedback into the oscillation loop OSL, as in FIG. 2, a transistor stage may be used for this purpose. For example, the oscillator arrangement VCXO, shown in FIG. 2, could be modified as follows. A cascode transistor is coupled between the collector of the transistor TO1 and the supply voltage terminal VCC. More specifically, the emitter of this cascode transistor is coupled to the collector of the transistor TO1, the base is coupled to a reference voltage, and the collector is coupled to the supply voltage terminal VCC via a resistor. The node of the capacitor CF1 which, in FIG. 2, is coupled to the common node of capacitors CO3 and CO4, is then coupled to the collector of the cascode transistor. For the rest, the filter FIL may remain the same as shown in FIG. 2.

In another modification of the oscillator arrangement shown in FIG. 2, which also comprises a cascode transistor as described above, the filter FIL is changed. In this modification, the node of the capacitor CB1, which is connected to the filter FIL in FIG. 2, is coupled to the collector of the cascode transistor. The collector of the cascode transistor is further coupled to the supply voltage terminal VCC via a resonant circuit. The resonant circuit has the function of filtering out the desired harmonic, whereas the cascode transistor has the function of preventing harmonic feedback into the oscillation loop. The resistor mentioned in the previous modification, which was coupled to the collector of the cascode transistor, may be omitted.

Instead of having a Colpitts type of oscillation loop OSL as in FIG. 2, any type of oscillation loop may be used. Furthermore, an electrically controllable reactance does not necessarily need to be coupled in series with a crystal, as in FIG. 2. The electrically controllable reactance may be arranged differently in the oscillation loop, for example, in parallel with the crystal. It should further be noted that a resonant circuit, of which the crystal and the electrically controllable reactance are part, may comprise more reactances or fewer reactances than are shown in FIG. 2. A resonant circuit which is more elaborate than that in FIG. 2 may, for example, provide a more linear tuning voltage versus output frequency characteristic.

Instead of having an output buffer BUF, which provides the oscillation output signal Sosc, as in FIG. 2, the output signal of the oscillator arrangement may be directly derived from the filter. For example, the common node of capacitor CF1 and inductor LF1 in FIG. 2 could be coupled to the input of a mixer stage, for example, without an intermediate transistor.

Instead of using the oscillator arrangement VCXO in a satellite TV receiver, as in FIG. 3, the oscillator arrangement may be advantageously applied in any type of receiver. Furthermore, the oscillator arrangement may be used for purposes other than for regenerating a symbol clock frequency, as in the receiver shown in FIG. 3.

In summary, the following has been disclosed in this specification. In an oscillator arrangement VCXO, an oscillation loop OSL oscillates at, approximately, the fundamental frequency of a crystal XTL included therein. The output signal Sosc of the oscillator arrangement VCXO is a harmonic extracted from the oscillation loop OSL. To vary the frequency of the output signal Sosc, tuning means VAR are included in the oscillation loop OSL. A stage FIL in the oscillator arrangement VCXO prevents harmonic feedback into the oscillation loop OSL. Such an oscillator arrangement VCXO can be tuned over a relatively large frequency range and has a monotonous tuning characteristic.

I claim:

1. An oscillator arrangement comprising a crystal which is part of an oscillation loop for an oscillation at, approximately, a fundamental frequency of said crystal, and a filter for passing a harmonic of said oscillation to an output, characterized in that said oscillation loop further includes tuning means for varying the frequency of said oscillation, and in that said oscillator arrangement includes a stage for preventing feedback of said harmonic extracted by said filter into said oscillation loop.

2. An oscillator arrangement as claimed in claim 1, wherein said filter constitutes said stage for preventing feedback and comprises means for attenuating said harmonic from said output to said oscillation loop.

3. An oscillator arrangement as claimed in claim 2, wherein said filter comprises a capacitor having a first node coupled to said oscillation loop, and an inductor having a first node coupled to a reference voltage terminal, second nodes of said capacitor and said inductor being mutually coupled and constituting an output of said filter.

4. An oscillator arrangement as claimed in claim 3, wherein said oscillation loop comprises two elements arranged in series and coupled between an amplifying device and the reference voltage terminal, and wherein the capacitor in the filter is coupled to a common node of said two elements.

5. An oscillator arrangement as claimed in claim 3, wherein said output of said filter is coupled to a relatively high impedance input of a further stage.

6. An oscillator arrangement as claimed in claim 5, wherein said further stage has a transfer characteristic which comprises a high-pass slope.

7. An oscillator arrangement as claimed in claim 6, wherein said further stage comprises a capacitor coupled in series with said relatively high impedance input, said capacitor having a relatively small value.

8. An oscillator arrangement as claimed in claim 6, wherein said further stage comprises a transistor in a common emitter configuration, and an emitter resistor and an emitter capacitor coupled in parallel between an emitter of said transistor and said reference voltage terminal.

9. A receiver comprising a synchronization loop for reproducing a reference signal in a transmission signal to be received, said synchronization loop comprising an oscillator arrangement for providing said reference signal, said oscillator arrangement comprising a crystal which is part of an oscillation loop for an oscillation at, approximately, a fundamental frequency of said crystal, and a filter for passing a harmonic of said oscillation to an output, characterized in that said oscillation loop further includes tuning means for varying the frequency of said oscillation, and in that said oscillator arrangement includes a stage for preventing feedback of said harmonic extracted by said filter into said oscillation loop.

* * * * *